United States Patent [19]

Dyck

[11] Patent Number: 5,354,981
[45] Date of Patent: Oct. 11, 1994

[54] SWITCHING PHOTOSENSITIVE MATRIX DEVICE

[75] Inventor: Rudolph H. Dyck, Palo Alto, Calif.

[73] Assignee: Loral Fairchild Corporation, Syosset, N.Y.

[21] Appl. No.: 91,348

[22] Filed: Jul. 14, 1993

[51] Int. Cl.$^5$ .................................... H01J 40/14
[52] U.S. Cl. .................................... 250/214 R; 356/5; 250/208.3
[58] Field of Search ............. 250/208.1, 208.3, 214 R, 250/214.1, 214 DC, 214 SW; 356/5

[56] References Cited

U.S. PATENT DOCUMENTS

| | | | |
|---|---|---|---|
| 4,821,036 | 4/1989 | Daffarn | 250/214 DC |
| 5,107,103 | 4/1992 | Gruss et al. | 250/208.3 |
| 5,118,180 | 6/1992 | Wichmann et al. | 356/5 |

Primary Examiner—David C. Nelms
Assistant Examiner—K. Shami
Attorney, Agent, or Firm—Perman & Green

[57] ABSTRACT

The disclosure describes one unit cell of a PNPN photo-switch array for an image sensor, including a PNPN light-activated thyristor (LAT), in the form of a two-terminal device, and a load FET. The FET functions as a load and as an on-off switch in series. The output of is a voltage at a first n node that controls the FET switch that connect a voltage-ramp input line to a capacitor and a diode that are connected in parallel. The other side of the diode is the input source of the unit cell that feeds charge into a vertical CCD analog shift register. At the start of a cycle of operation, such as the beginning of a sweep of a radiation beam and prior to a pulse of a target reflection pulse, being directed onto the pnpn photoswitch, the voltage level at the first node is high. At the time when a pulse of radiation is directed onto the photoswitch the first node goes low turning the switching transistor off. The capacitor has a charge level at an analog value representative of the elapsed time between the beginning of the cycle, such as the beginning of a radiation beam sweep, an the occurrence of the pulse reflected from a target. At the end of a cycle the charge is transferred into a CCD readout register.

15 Claims, 4 Drawing Sheets

SWITCHING PHOTOSENSITIVE MATRIX DEVICE

BACKGROUND OF THE INVENTION

1. Field of the Invention

The present invention relates to photosensitive switches, and more particularly to photosensitive switches incorporated into a two-dimensional array, that switches element by element in response to light, the array also incorporating a memory means and a readout means.

2. Discussion and the Background Art

In prior art three-dimensional imaging, range finding by light strip techniques is typically utilized. In a conventional light stripe ranging system a range map is obtained by projecting a light stripe onto a scene, obtaining a camera image of the scene, extracting the projected stripe position, and stepping the light stripe and repeating the process until the entire scene has scanned, thus forming a single resultant 3D image of the entire scene.

In a second type of three-dimensional camera, a fan-shaped beam of light originating from a source located to the side of receiving aperture of the camera sweeps across the field of view, once for each frame time/exposure time of the camera. The light beam from the field of view falls on a photosensitive array in the camera that activates a switch and thereby records element by element the time when the light beam was sensed. This second type system is described in U.S. Pat. No. 5,107,103 discussed below.

U.S. Pat. No. 5,107,103 issued Apr. 21, 1992 to Gruss et al. entitled "Integrated Circuit Having At Least A Sensor And A Processor Thereon" describes a circuit that may be employed in an image scanning system having an integrated circuit that comprises a sensor which produces a sensor signal corresponding to energy received. The integrated circuit is also comprised of a processing element connected to the sensor which receives the sensor signal only from the sensor and produces a processed signal corresponding to the sensor signal. Additionally, there is a memory connected to the processing element for receiving the processed signal and storing the processed signal. In a preferred embodiment, the integrated circuit is also comprised of a buffer connected to the sensor and the processing element for receiving the sensor signal and buffering the sensor signal for reception by the processing element. The sensor can include a photodiode which receives the sensor signal corresponding to light energy it receives. In a more preferred embodiment, the integrated circuit includes a photosensitive array comprised of cells for use in a light stripe rangefinder wherein a plane of light is moved across a scene. Each cell is able to detect and remember the time at which it observes the increased light intensity thereon.

U.S. Pat. No. 5,118,180 issued Jan. 2, 1992 to Wichmann et al., entitled "Method And Apparatus For Determining The Range Of Vision Of A Motor Vehicle Driver Upon Encountering Fog Or Other Obstacles" describes a method and apparatus for determining the range of vision of the driver of a motor vehicle upon encountering a fog. A transmitter and receiving member are mounted on the front portion of the motor vehicle. A series of beams are transmitted from the rangefinder to different measured portions of the roadway. The reflections from the roadway are monitored. When the atmospheric conditions change so that a fog or other obstacle appears in the roadway, the reflected signal will take on different characteristics or will not appear at all. The driver of the motor vehicle can have a visual and/or an acoustic warning indication inside the vehicle to note that some dangerous conditions exists.

Background references that relate to three-dimensional imaging using a time/distance feature of a laser to obtain the depth/range/distance dimension of an image or scene include U.S. Pat. No. 3,682,553 issued Aug. 8, 1972 to Kapany entitled "Apparatus For Acquiring And Laying Real Time 3-D Information"; U.S. Pat. No. 4,199,253 issued Apr. 22, 1980 to Ross entitled "Methods And Systems For Three-Dimensional Measurement"; U.S. Pat. No. 4,708,473 issued Nov. 24, 1987 to Metzdorff et al. entitled "Acquisition of Range Images"; U.S. Pat. No. 4,854,698 issued Aug. 8, 1989 to Schmidt entitled "3-D Measurement Via Multiple Gating"; U.S. Pat. No. 4,967,270 issued Oct. 30, 1190 to Ulich et al. entitled "Lidar System Incorporating Multiple Cameras For Obtaining A Plurality Of Subimages" and U.S. Pat. No. 5,110,203 issued May 5, 1992 to MacCabee entitled "Three Dimensional Range Imaging".

Background references that describe electro-optical relays include U.S. Pat. No. 4,902,901 issued Feb. 20, 1990 to Pernyeszi entitled "High-Power Solid State Relay Employing Photosensitive Current Augmenting Means For Faster Turn-On Time"; U.S. Pat. No. 4,912,335 issued Mar. 27, 1990 to Ehalt et al. entitled, "Means For Rapid Charging And Dynamic Discharging Of A Capacitively Charged Electrical Device"; U.S. Pat. No. 4,931,656 issued Jun. 5, 1990 to Ehalt et al. entitled, "Means To Dynamically Discharge A Capacitively Charged Electrical Device"; and U.S. Pat. No. 4,939,375 issued Jul. 3, 1990 to Walters et al. entitled "Solid State Relay With Shield Means".

SUMMARY OF THE INVENTION

An object of the present invention is to provide a pn-junction light sensing circuit including high-sensitivity photoswitches.

Another object of the present invention is to provide a pn-junction light sensing circuit having sensing, amplifying and switching functions in one circuit module of minimal size.

A further object of the present invention is to provide a photodiode sensing circuit including a PNPN photoswitch cell.

A still further object of the present invention is to provide a photodiode sensing circuit including a charge coupled device readout means.

Still another object of the present invention is to provide a pn-junction light sensing circuit including an PNPN photoswitch in combination with a capacitor for time-sampling a ramp voltage for time measurements.

DESCRIPTION OF THE INVENTION

Figure 1:
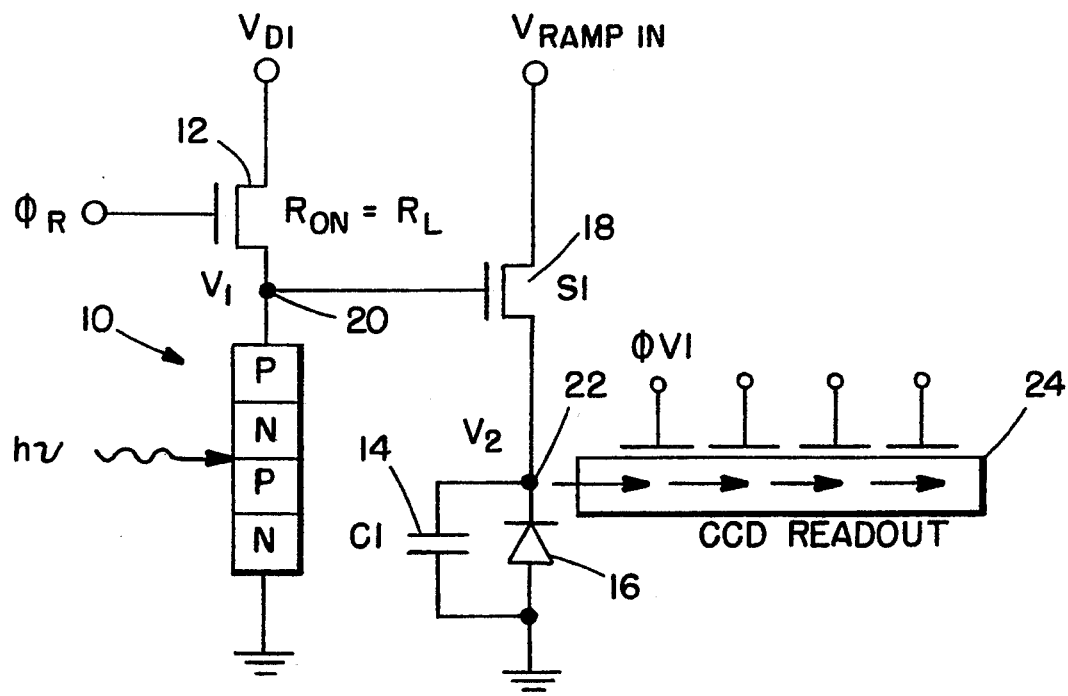
FIG. 1 is a schematic circuit diagram illustrating a pnpn-based unit cell according to the principles of the present invention.

The circuit of the embodiment shown in FIG. 1 includes a two terminal photoswitch 10 connected to ground potential and at node 20 to a load transistor 12 which is also switched by a reset pulse $\phi_r$ applied to its gate electrode 12. Node 20 is normally at a voltage level V1. A switching transistor 18 is connected between a source of ramp voltage and a capacitor 14 and a diode 16 which are connected in parallel between ground potential and switching transistor 18 is connected to the voltage V1 at node 20. A charge-coupled-device readout means 24 is also connected to capacitor 14 at node 22.

In FIG. 1, at the start of a cycle, such as the beginning of a sweep of a radiation beam in the case of a rangefinder, and prior to a pulse of radiation, such as a target reflection pulse, being directed onto the pnpn photoswitch 10, the voltage level V1 at node 20 is high. Transistor switch 18 is open and the ramp voltage signal is connected to capacitor 14 which starts to charge and the voltage level V2 at node 22 begins to increase.

At the time when a pulse of radiation is directed onto photoswitch 10, the node 20 goes low causing the gate of switching transistor 18 off. Capacitor 14 will stop charging at this time, and the charge level will be at an analog value representative of the elapsed time between the beginning of the cycle, such as the beginning of a radiation beam sweep, and the occurrence of a radiation pulse, such as a pulse reflected from a target. At the end of a cycle, such as the end of a radiation beam sweep, the charge is transferred into a charge-coupled-device readout register.

At the end of a cycle and the start of a new cycle, such as the end of one radiation beam sweep and the beginning of another, a reset pulse $\phi_r$ is applied to load transistor 12 which switches and voltage V1 at node 20 goes high again, switching transistor 18 turns on and the ramp voltage signal is connected to capacitor 14 which begins to charge again.

Figure 4:
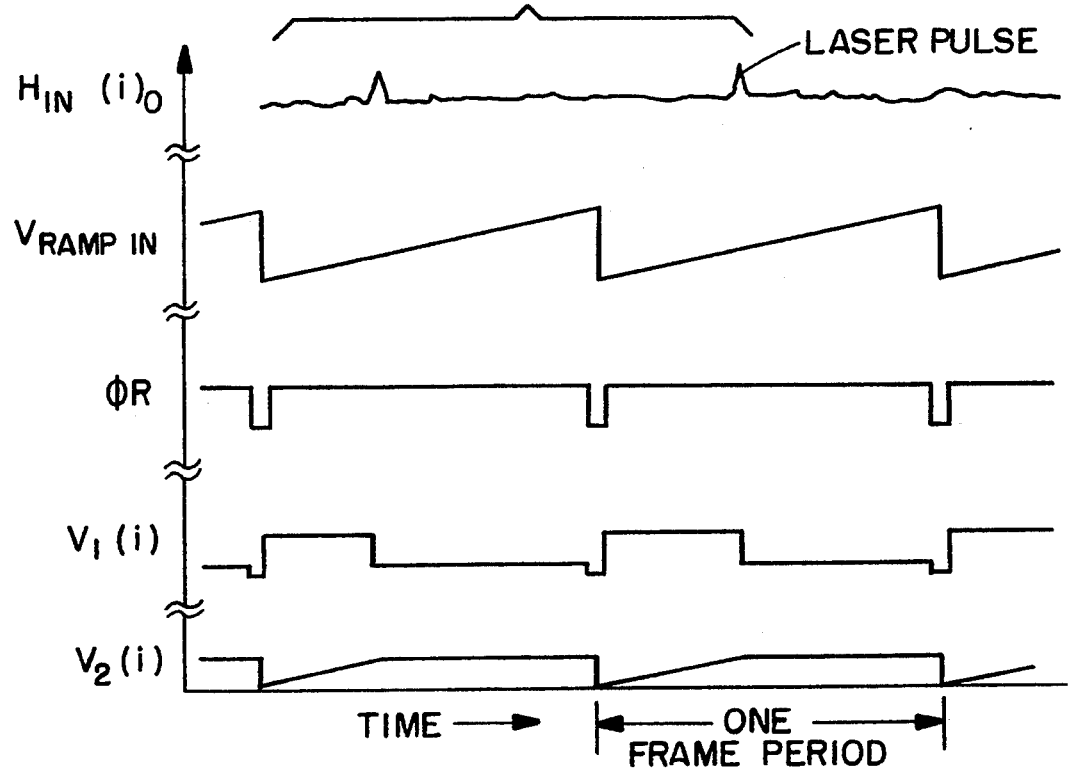
FIG. 4 is an illustration of a series of waveforms useful in the explanation of the operation of the circuit shown in FIG. 1.

The relationship between the radiation pulse, the ramp voltage signal, the reset pulse, the voltage V1 at node 20 and the voltage V2 at node 22 as a function of time is illustrated in FIG. 4.

More particularly, FIG. 1 shows a schematic circuit diagram of one unit cell of the first embodiment of the PNPN photoswitch array. The first stage of the circuit includes the PNPN light-activated thyristor (LAT) 10, in the form of a two-terminal device, and a load field-effect transistor (FET) 12. LAT 10 may also be a three-terminal device together with appropriate circuitry such that the third terminal functions as a control gate and this gate is wired to control the gain or to adjust the trigger level of the LAT 10. The transistor 18 functions as a load and as an on-off switch in series. In this embodiment the N-emitter of the LAT 10 is connected to the array ground. The output of this first stage is a voltage (V1) at node 20 that controls FET switch 18 that can connect a voltage-ramp input line to a capacitor 14 and a PN diode 16 that are connected in parallel. The N side of diode 16 at node 22 is the input source of the unit cell that can feed signal charge into a vertical charge-coupled device (CCD) 24 analog shift register. Since there are a number of practical designs for this vertical shift register, the details need not be described herein; however, as shown in the following description, the preliminary layout of this first embodiment makes use of a 2-phase CCD register design that does not require a separate transfer electrode and transfer clock.

Figure 2:
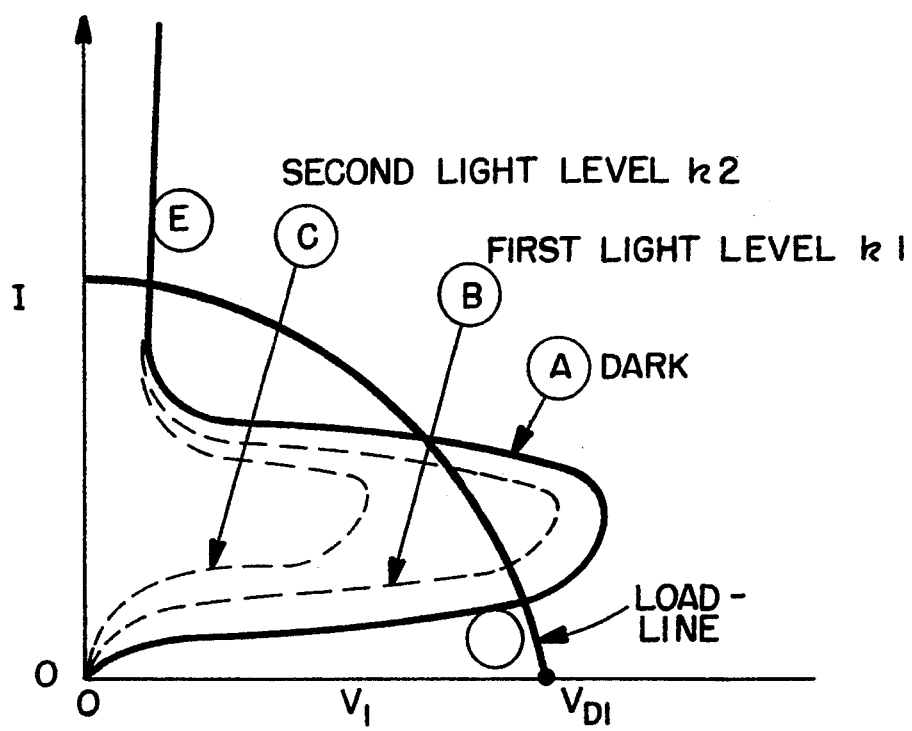
FIG. 2 is an illustration of representative current-voltage curves and a loadline curve for the circuit shown in FIG. 1.

FIG. 2 shows the current-voltage characteristics (I vs. $V_1$) of the two-terminal LAT 10 for three cases: dark, first light level h1, and second light level h2. Also shown is the load line for the load circuit device 12 when the gate of the load element connected to node 20 is in the ON state. In the dark case, and for a range of applied voltages, the current is very low. Referring to FIG. 2, given the load line shown, the LAT 10 would be at State D. Depending on the slope and shape of the load line, and on the applied voltage, as the light level is (relatively slowly) increased a point is reached where the LAT device 10 would switch to State E. Referring to FIG. 2, this occurs between the first and second light levels. Just prior to switching, the voltage across the LAT device 10 would decrease somewhat from that in State D, but when the LAT device 10 switches there would be a substantial drop in this voltage.

Figure 3:
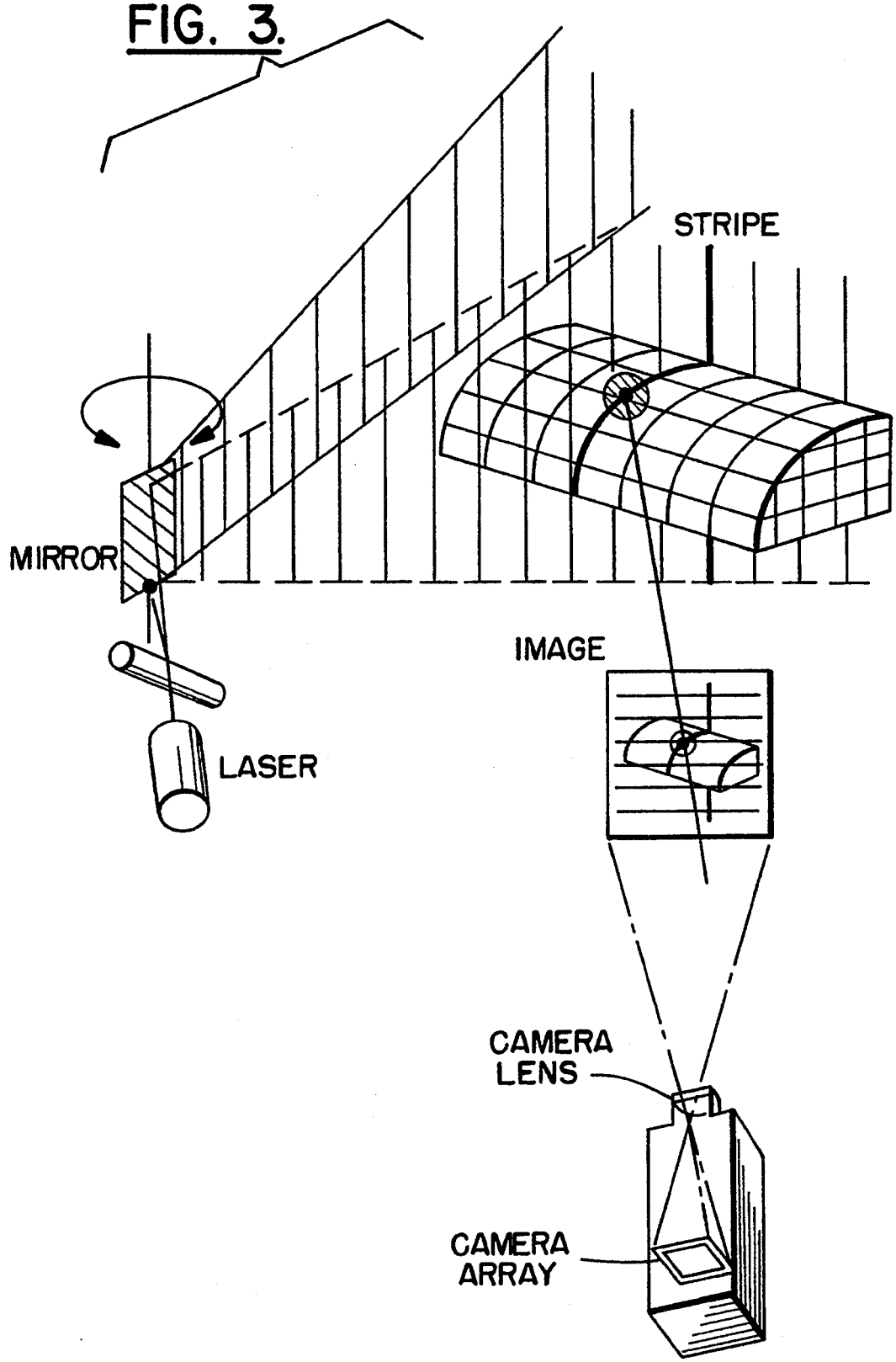
FIG. 3 is an illustration of a camera system in which the photoswitch element of the present invention may be used.

In order to understand the operation of this first embodiment in a range-image sensor with a 3D camera, it is necessary to know the principles of operation of the complete camera system, and how it is configured and operated. FIG. 3 shows a schematic of the complete camera system. In addition to the camera itself, there is a fan-beam illumination source to the side of the camera, and a scanning means for sweeping the fan beam across the field of view (FOV) of the camera. The width of the fan beam fills the FOV of the camera and the thickness of the beam is very small. For example, in some applications it is desirable to have a beam thickness that is approximately 0.1% of the FOV in the scanning direction.

The camera system operates at approximately television frame rate, and the fan beam makes one scan per frame. (While television cameras generally operate in the two- field-per-frame interlaced mode, this camera will generally operate non-interlaced.)

The main principle of operation is that as the beam sweeps across the field of view of the camera each unit cell of the sensor array senses the time, relative to the start of the frame, when the beam crosses the picture element (pixel) to which it is directed or on which it is focussed. In the unit cell shown in FIG. 1; this information is stored as a charge on a capacitor 14, the amount of charge depending on the voltage on a ramp-input line at the instant the beam crosses that pixel. At the end of that frame period and before the start of the next beam scan, the charge is transferred into the corresponding stage of the set of vertical CCD registers 24, and the LAT 10 circuits are all reset by $\phi_r$ and transistor 12 for the next frame period. During this next frame period, and while the next beam scan is taking place, the charge from the first frame is read out of the CCD array 24 and thereby generates a video signal at the output of the preamplifier located on the silicon chip along with the array. An off-chip signal processing is then used to compute absolute range or differential range; this requires knowledge about the voltage ramp input, the baseline distance between the camera and the effective point of origin of the fan beam, plus any correction terms and correction factors.

Since there may be ambient light present, the fan beam will in general be monochromatic and a narrow-band optical filter may be provided at the camera lens to minimize any undesirable effects of this ambient light.

Referring to FIG. 4, a plurality of curves are is provided to describe the operation of the unit cell circuit described in FIG. 1. In FIGS. 4, consider one unit cell and assume that the light intensity (h(i)) is as shown. In this example, the fan beam is considered to be generated by a CW laser, and the instantaneous intensity when the beam is on the element is large (i.e., a pulse) compared to that due only to the ambient light. Similarly, the instantaneous current in the LAT 10 is considered to be large compared to the sum of the ambient-light photocurrent plus dark current. The figure also shows the voltage ramp input, the reset clock $\phi$ with its LOW period at the end of each frame period, the voltage of the output node 20 of the first stage of the circuit (V1(i)), and the voltage (V2(i)) on the sampling capacitor 16 at node 22.

At the end of the time that the reset $\phi_r$ is LOW the voltage across the LAT 10 is essentially zero. Next the clock goes HIGH at a rate sufficiently slowly that the LAT 10 is biased without turning it on. Then the cell waits until an instantaneous light level occurs that can turn on the LAT 10. It should be noted that this image sensor does not operate in the storage mode in which most other image sensors operate. When this occurs, voltage V1 at node 20 goes LOW and the capacitor 14 holds the voltage of the ramp input for that moment in time as shown by the voltage V2 waveform in FIG. 4. The operation of the photoswitch function of this novel 3D camera image sensor has been described. Since the CCD operation is conventional image sensors is well understood by those skilled in the art of field of electronic imaging, and since the CCD operation in this 3D camera system is generally the same, a detailed description is not presented here, but only a brief description.

Figure 5:
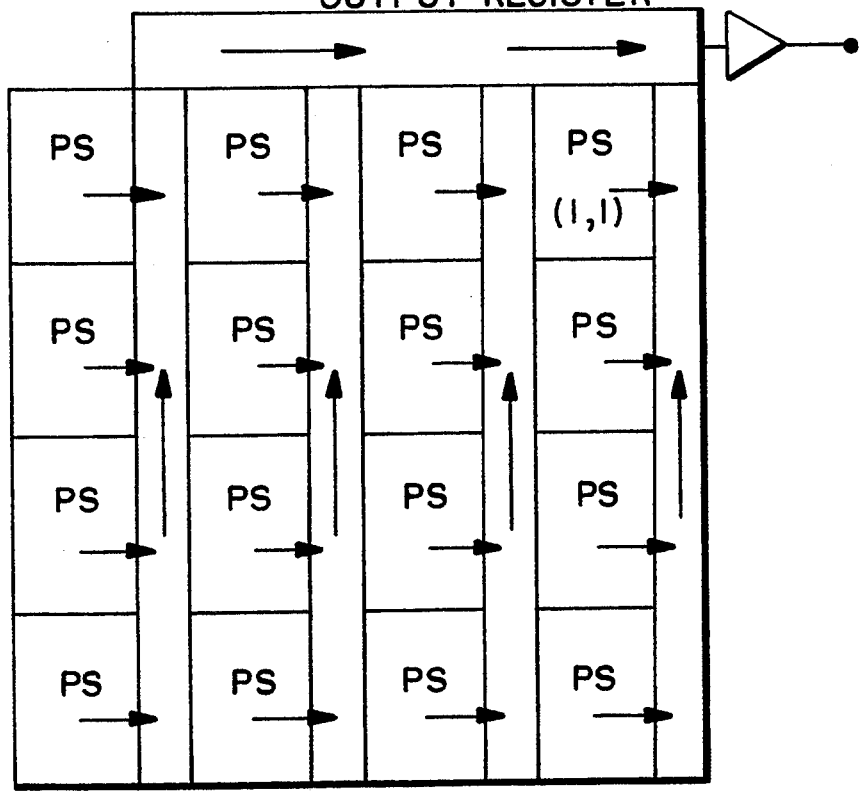
FIG. 5 is a schematic illustrations of a top view of a representative architecture of an image sensor composed of a plurality of photoswitch elements of FIG. 1.

FIG. 5 is an illustration of a representative architecture of the image sensor composed of a plurality of photoswitch elements such as shown in FIG. 1. FIG. 4 shows a 4×4-element array of photoswitch elements, four vertical CCD registers, one output register and one sense amplifier. In the field of conventional image sensors this would be referred to as the Interline Transfer (ILT) architecture. In this architecture, all elements are read into the vertical registers at one time, and then, row by row, the charge packets are shifted upward and into the output register. After a row of charge packets is transferred into the output register it is then transferred, at an appropriate higher clocking rate, into the sense amplifier where each charge packet produces an output voltage proportional to the amount of charge in the packet. Typically the video output sample rate is of the 12 order of 1–10MHz so that, depending on the size of the array, the frame rate can be near 30Hz as in broadcast television, or can be significantly greater.

Figure 6:
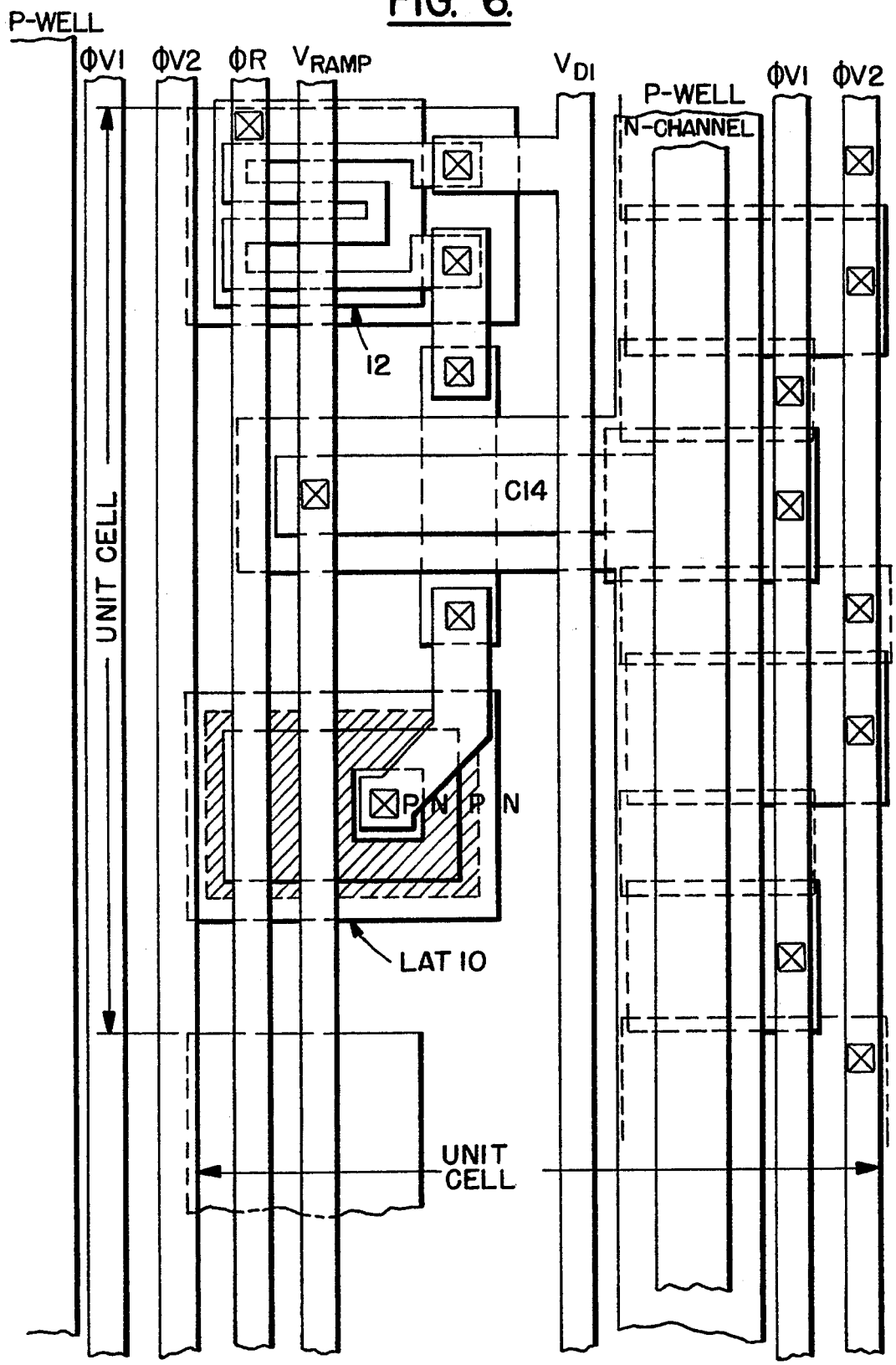
FIG. 6 is an illustration of a plan-view of a layout of an embodiment of the circuit illustrated in FIG. 1.

The embodiment of the unit cell shown in schematic form in FIG. 1 is illustrated in layout form in FIG. 6. As shown in FIG. 6 it was practical to have for the vertical register design a 2-phase CCD and to have two CCD register stages for each unit cell. One reason for having two stages instead of one has to do with the practical matter of efficiently moving charge packets the actual distance of the vertical dimension (height) of the unit cell, which in a practical example is 74um. A second reason why it is advantageous to have the additional stage is that the influence of charge transfer inefficiency on the accuracy of the time-readings is minimized. Also having two CCD register stages per unit cell allow a buffer stage between each principal signal charge packet. Such buffer stage is of benefit in that it can reduce the mixing of signals associated with adjacent principal charge packets.

Since is preferred to use N-channel CCD technology in image sensors, when charge is read out of the unit cell, it is an electron charge packet which is created, and the n-region at the capacitor 14 is brought to a final positive bias. This bias level is determined by the threshold voltage of the input barrier region of the CCD structure and by the voltage level of the transfer pulse applied to the receiving CCD phase—$\phi_{v1}$ in FIG. 6.

Regarding the optimization of the LAT unit cell 10 in this photoswitch image sensor array for the 3D camera system, it is desirable to have the applied voltage VD1 not be too high, and the ON-state current (at State E in FIG. 2) also not be too high. This minimize both power dissipation and noise generation between unit cells and from unit cells to the output terminal. For example, optimum VD1 level is near 10V and the optimum ON-state current might be in the range 50–1000nA, depending on a number of design variables.

Regarding the optimization of the photoswitch image sensor array as a whole, it is desirable to have all the properties of the unit cell be as uniform as possible across the array. This applies especially to the current and voltage behavior of the LAT 10 itself in the threshold region or switching region of the I-V domain, and especially to the load element. Therefore it is anticipated that high-precision ion implantation and high-precision mask alignment and mask processing in general will be of significant benefit it making a useful device.

What has been described is an improved photosensitive switch may be incorporated into a two-dimensional array that switches element by element in response to a sweep of a light beam. The photosensitive switch includes a pn function light sensing circuit including a pn pn photoswitch in combination with a capacitor and a ramp voltage sensing, amplifying and switching functions in one circuit module of minimal size.

While the invention has been described in connection with a preferred embodiment, it is not intended to limit the scope of the invention to the particular form set forth, but, on the contrary, it is intend to cover such alternatives, modifications, and equivalence as may be included within the spirit and scope of the invention as defined in the appended claims.

I claim:

1. A photosensitive switch circuit for providing an output signal in response to a pulse of radiation directed thereon comprising:
   a pnpn photoswitch means,
   load means connected to said pnpn photoswitch means at a first node, said load means further connected to a potential source to provide a first voltage level value at said first node,
   a switch means being connected to a voltage ramp signal source and connected to and controlled by said voltage level at said first node,
   a capacitor storage means connected to said switch means, said switch means connecting said voltage ramp signal source to said capacitor storage means to charge said capacitor means as said voltage ramp signal increases, and said pnpn photoswitch being activated during the said charging of said capacitor storage means in response to a pulse of radiation directed thereon to produce a change of said voltage level at said first node from said first voltage level to a second voltage level, said level change of voltage at said first node operating said switch device to disconnect said voltage ramp signal from said capacitor storage means wherein said capacitor storage means contains a particular amount of charge representative of the elapsed time between the start of the voltage ramp signal and the activation of the pnpn photoswitch by said pulse of radiation.

2. A photosensitive switch circuit according to claim 1 wherein said pnpn photoswitch means is a two-terminal device.

3. A photosensitive switch circuit according to claim 1 wherein said pnpn photoswitch means is a three-terminal device wherein said third terminal is a control gate.

4. A photosensitive switch circuit according to claim 1 wherein said load means is a transistor device having a first electrode connected to said pnpn photoswitch at said first node, and a second electrode connected to said potential source to provide said voltage level at said first node.

5. A photosensitive switch circuit according to claim 4 further including means connected to said transistor device load means for resetting said photoswitch.

6. A photosensitive switch circuit according to claim 4 wherein said switch means is a transistor device having a first electrode connected to said voltage ramp signal source, a second electrode connected to said capacitor storage means at a second node and a third electrode connected to said voltage level at said first node, wherein said voltage level change produced at said first node by said activated pnpn photoswitch switches said transistor device switch means which disconnects said voltage ramp signal source from said capacitor storage means at said second node when said pulse of radiation is directed onto said pnpn photoswitch.

7. A photosensitive switch circuit according to claim 6 further including a readout means connected to said capacitor storage means, and wherein said load transistor device includes a third electrode connected to a reset pulse signal source and responsive to a reset pulse occurring after said pulse of radiation to change said voltage level at said first node from said second level back to said first level thereby switching said transistor device switch means to reconnect said voltage signal source to said capacitor storage means and wherein said particular amount of charge in said capacitor storage means is discharged into said readout means and whereby new charge flows into said capacitor storage means.

8. A photosensitive switch circuit according to claim 6 wherein said capacitor storage means includes a capacitor element and a diode connected in parallel to said second node.

9. A photosensitive switch circuit according to claim 6 wherein said readout means is a charge-coupled-device register responsive to said particular amount of charge from said capacitor storage means to provide an output signal representative thereof.

10. A switching photosensitive matrix for detecting pulses of radiation, and for storing and outputting signals representing the occurrence times of the pulses of radiation, said matrix having a plurality of unit cells comprising:

a pnpn photoswitch means, load means connected to said pnpn photoswitch means at a first node, said load further connected to a potential source to provide a first voltage level value at said first node, means for resetting said photoswitch, a voltage ramp signal source, a capacitor storage means, a switch means connecting said voltage ramp signal source to said capacitor storage means and controlled by the voltage on said first node, a charge-coupled-device register outputting means, said pnpn photoswitch being activated during the said charging of said capacitor storage means in response to a pulse of radiation directed thereon to produce a change of said voltage level at said first node to a second voltage level, said level change of voltage at said first node operating said switch means to disconnect said voltage ramp signal from said capacitor storage means wherein said capacitor storage means contains a particular amount of charge representative of the elapsed time between the start of the voltage ramp signal and the activation of the pnpn photoswitch by said pulse of radiation.

11. A photosensitive matrix according to claim wherein said load means is transistor device having a first electrode connected to said pnpn photoswitch at said fist node, and a second electrode connected to said potential source to provide said voltage level at said first node, and means for adjusting said load means and resetting said photoswitch.

12. A switching photosensitive matrix according to claim 11 wherein said switch means is a transistor device having a first electrode connected to said voltage ramp signal source, a second electrode connected to said capacitor storage means at a second node and a third electrode connected said voltage level at said first node, wherein said voltage level change produced at said first node by said activated pnpn photoswitch switches said transistor device switch means which disconnects said voltage ramp signal source from said capacitor storage means at said second node when said pulse of radiation is directed onto said pnpn photoswitch.

13. A switching photosensitive matrix according to claim 12 wherein said capacitor storage means includes a capacitor element and a diode connected in parallel to said second node.

14. A photosensitive switch circuit according to claim 12 wherein said charge-coupled-device register outputting means includes a charge-coupled-device register responsive to said particular amount of charge from said capacitor storage means to provide an output signal representative thereof.

15. A photosensitive switch circuit according to claim 14 wherein said charge-coupled-device register is a structure having two charge-coupled-device register stages for each of said unit cells.

* * * * *